(12) United States Patent
Fujiwara

(10) Patent No.: US 7,864,626 B2
(45) Date of Patent: Jan. 4, 2011

(54) INTERFACE CIRCUIT, MEMORY INTERFACE SYSTEM, AND DATA RECEPTION METHOD

(75) Inventor: Susumu Fujiwara, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 307 days.

(21) Appl. No.: 12/058,121

(22) Filed: Mar. 28, 2008

(65) Prior Publication Data

US 2008/0239843 A1    Oct. 2, 2008

(30) Foreign Application Priority Data

Mar. 30, 2007   (JP) .............................. 2007-93851

(51) Int. Cl.
G11C 7/10   (2006.01)
G11C 7/22   (2006.01)
G11C 11/409   (2006.01)

(52) U.S. Cl. .................... 365/233.13; 365/189.05; 365/233.16; 365/233.1; 365/193; 365/194

(58) Field of Classification Search ............... 365/193, 365/194, 189.05, 233.1, 233.13, 233.16
See application file for complete search history.

(56) References Cited

U.S. PATENT DOCUMENTS

| | | | |
|---|---|---|---|
| 4,063,244 A * | 12/1977 | Van de Kop | 342/394 |
| 5,896,347 A * | 4/1999 | Tomita et al. | 365/233.11 |
| 6,330,636 B1 * | 12/2001 | Bondurant et al. | 711/105 |
| 2002/0122348 A1 * | 9/2002 | Lee et al. | 365/233 |
| 2002/0176447 A1 * | 11/2002 | Marx et al. | 370/503 |
| 2004/0217386 A1 * | 11/2004 | Lee | 257/209 |

* cited by examiner

Primary Examiner—J. H. Hur
(74) Attorney, Agent, or Firm—Arent Fox LLP

(57) ABSTRACT

An interface circuit includes a delay circuit that generates a delay signal obtained by delaying a data strobe signal, a first logical circuit that performs a logical operation of on the data strobe signal and the delay signal, and outputs an operation result as a first strobe signal, a second logical circuit that receives the first strobe signal and generates a second strobe signal that is complementary to the first strobe signal; a first latch circuit that latches a data signal based on the first strobe signal, and a second latch circuit that latches the data signal based on the second strobe signal.

20 Claims, 6 Drawing Sheets

INTERFACE CIRCUIT, MEMORY INTERFACE SYSTEM, AND DATA RECEPTION METHOD

CROSS-REFERENCE TO RELATED APPLICATIONS

This application is based upon and claims the benefit of priority from Japanese Patent Application No. 2007-093851 filed on Mar. 30, 2007, the entire contents of which are incorporated herein by reference.

BACKGROUND OF THE INVENTION

1. Field of the Invention

The application relates to an interface circuit that exchanges signals with a memory, and the like.

2. Description of Related Art

In recent years, DRAM (Dynamic Random Access Memory) has been used as a semiconductor storage device having large storage capacities. A double data rate system is adopted as a high-speed data transfer method in order to respond to an increasing operation speed of a system. Such a semiconductor storage device is called DDR-SDRAM (Double Data Rate Synchronous Dynamic Random Access Memory) or DDR2-SDRAM. The DDR-SDRAM adopts a double rate system. In the double rate system, the DDR-SDRAM outputs data DQ in synchronization with a rise and fall of a clock signal and also outputs a data strobe signal DQS. A memory interface circuit provided in a host apparatus (such as a CPU and memory controller) receiving the data DQ receives the data strobe signal DQS to adjust timing for capturing the data DQ. The memory interface circuit is required to decrease malfunctions.

In the double data rate system, two pieces of data are input/output in one cycle (one period of a clock signal). Thus, a pulse width of data to be input/output becomes shorter than that of data of the SDRAM. Moreover, the wiring length between the DDR-SDRAM (hereinafter simply called the memory) and the host apparatus, such as a CPU, is different from system to system. Thus, a difference of the time (flight time) required for data to reach the host apparatus (interface circuit) arises, and the difference makes it difficult for the interface circuit to determine timing for capturing data. For this reason, the memory outputs a data strobe signal to notify the interface circuit of the timing to send out data. Based on the data strobe signal, the interface circuit can reliably capture data.

SUMMARY

Disclosed herein is an interface circuit, including: a delay circuit that generates a delay signal obtained by delaying a data strobe signal; a first logical circuit that performs a logical operation of on the data strobe signal and the delay signal, and outputs an operation result as a first strobe signal; a second logical circuit that receives the first strobe signal and generates a second strobe signal that is complementary to the first strobe signal; a first latch circuit that latches a data signal based on the first strobe signal; and a second latch circuit that latches the data signal based on the second strobe signal.

DESCRIPTION OF THE PREFERRED EMBODIMENTS

Figure 1:
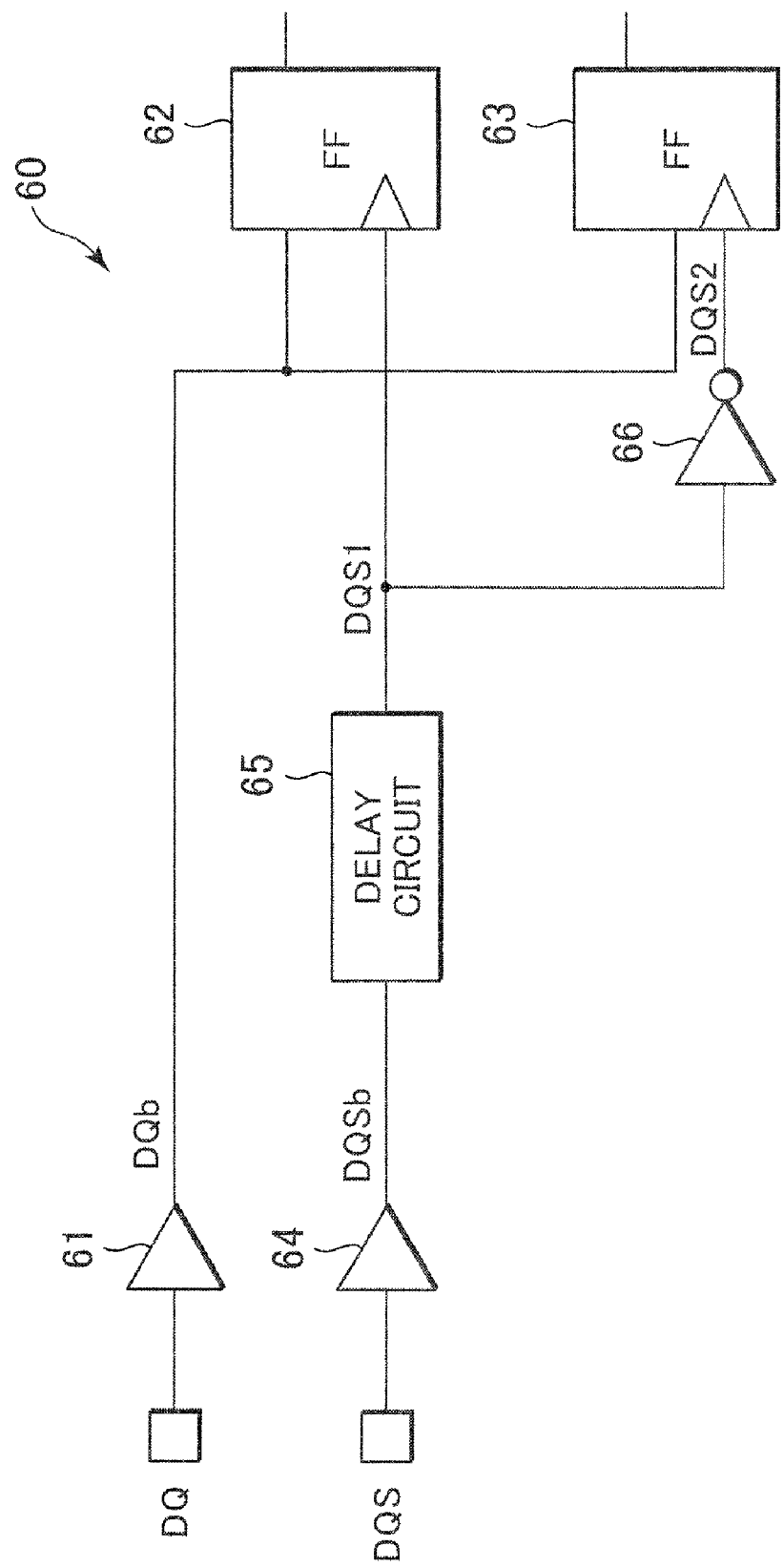
FIG. 1 shows a memory interface circuit.

FIG. 1 shows a memory interface circuit. The interface circuit 60, for example, is provided in a host apparatus. A buffer circuit 61 of the interface circuit 60 outputs a signal DQb obtained by amplifying data DQ. The signal DQb is input into each of input terminals of flip-flop circuits (FF circuits) 62 and 63. A buffer circuit 64 outputs a signal DQSb obtained by amplifying a data strobe signal DQS. A delay circuit 65 is provided to ensure a setup time for data. The delay circuit 65 outputs a signal DQS1 obtained by delaying a phase of an input signal by 90 degrees. The signal DQS1 is input into a clock terminal of the first FF 62. The signal DQS1 is also inverted by an inverter circuit 66 and an inverted signal DQS2 is input into a clock terminal of the second FF 63. The first FF 62 holds the signal DQb in synchronization with a rising edge of the signal DQS1 and also outputs a signal whose level is substantially equal to that of the held signal. The second FF 63 holds the signal DQb in synchronization with a rising edge of the signal DQS2 and also outputs a signal whose level is substantially equal to that of the held signal.

Figure 2:
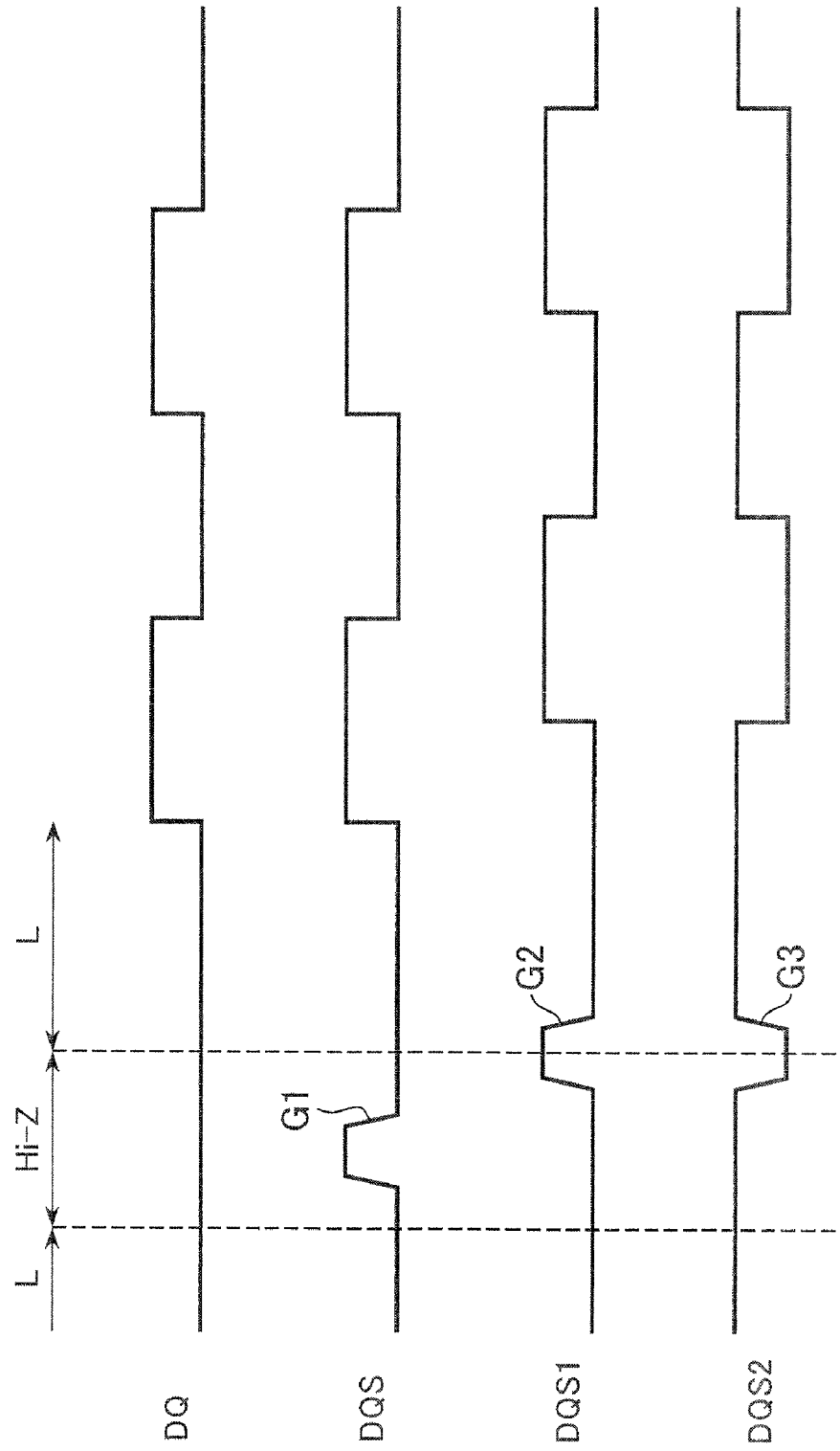
FIG. 2 shows an operation timing diagram of the memory interface circuit.

FIG. 2 shows operation timing of the memory interface circuit. As shown in FIG. 2, the signals DQS1 and DQS2 input into the clock terminals of the first FF 62 and second FF 63 of FIG. 1 are inverted with each other and therefore, the phase difference between the signal DQS2 and the signal DQS1 is substantially 180 degrees. Due to the delay circuit 65 shown in FIG. 1, the phase difference of these signals DQS1 and DQS2 and the data strobe signal DQS are 90 degrees. The data strobe signal DQS changes in synchronization with the data DQ. That is, the data strobe signal DQS and the data DQ are in phase. Thus, by operating the first FF 62 shown in FIG. 1 based on the signal DQS1 having a phase difference of 90 degrees with the data DQ, and operating the second FF 63 shown in FIG. 1 based on the signal DQS2 having a phase difference of 270 degrees with the data DQ, the interface circuit can alternately capture the data DQ. That is, the data strobe signal DQS acts as a reference clock for inputting the data DQ.

Incidentally, the interface circuit outputs to a memory the data DQ in synchronization with the data strobe signal DQS also when data is written into a memory from a host apparatus, such as a CPU. That is, the data strobe signal DQS is used as a bi-directional signal. Thus, as shown in FIG. 2, the data strobe signal DQS becomes a high impedance signal (Hi-Z) when the host apparatus outputs an L-level data strobe signal DQS and the memory outputs an L-level data strobe signal DQS. If, in this Hi-Z period, noise intrudes from outside, glitch noise G1 may arise in the data strobe signal DQS.

The interface circuit 60 shown in FIG. 1 generates pulse-shaped glitch noise G2 and G3 in response to the glitch noise G1. Thus, a malfunction may occur if the first FF 62 or the second FF 63 shown in FIG. 1 capture unintended data DQ in response to the glitch noise G2 or G3.

Figure 3:
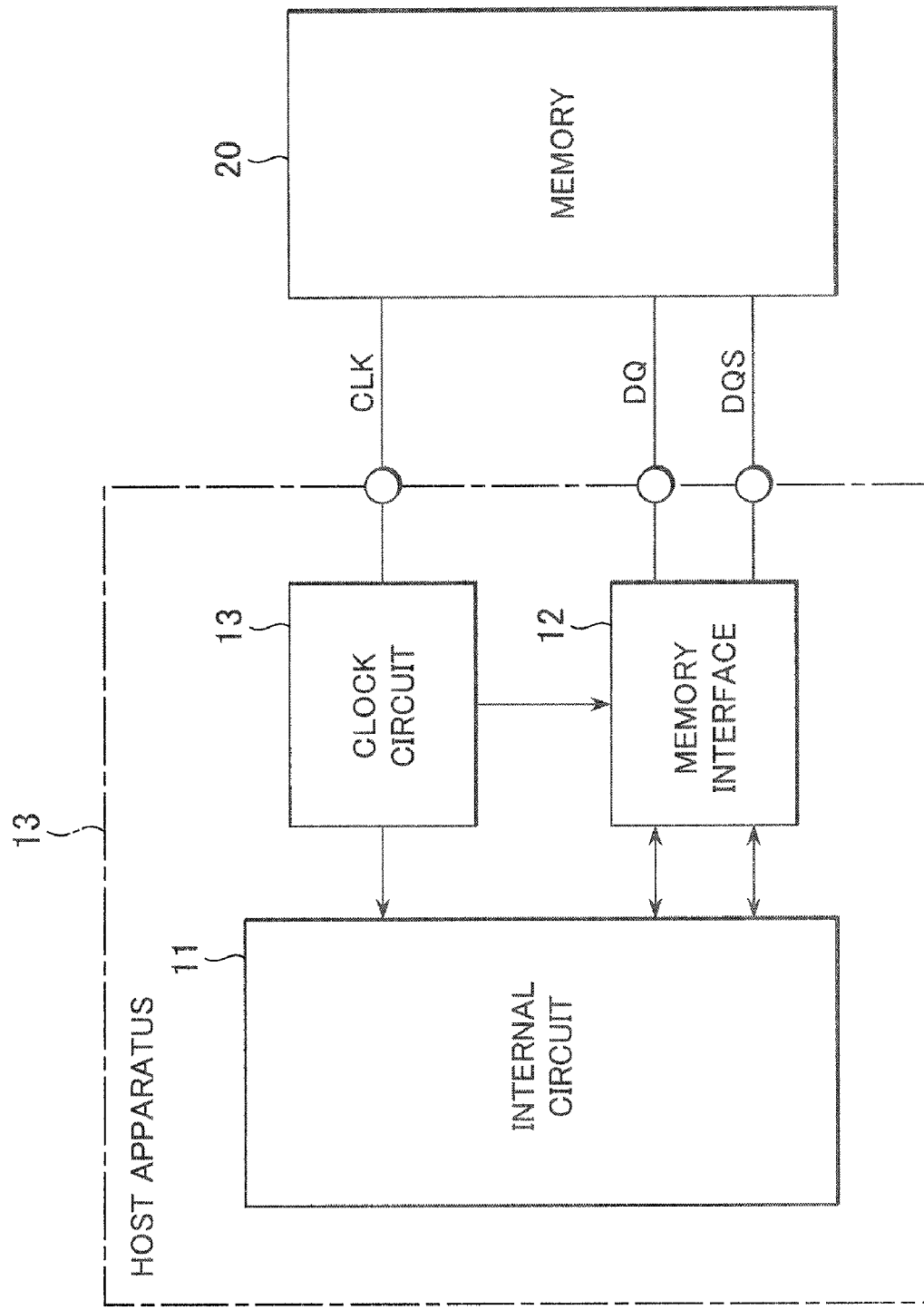
FIG. 3 shows a first embodiment of the invention.

FIG. 3 shows a first embodiment of the invention. A host apparatus 10 includes, for example, a CPU (not shown in FIG. 3) and a memory 20 that is connected to the host apparatus 10. The memory 20 is DDR-SDRAM. The host apparatus 10 and the memory 20 are configured in such a way that data DQ is exchanged based on the data strobe signal DQS.

The host apparatus 10 further includes an internal circuit 11 for an arithmetic calculation. The internal circuit 11 is connected to a memory interface circuit 12. The memory interface circuit 12 is connected to the memory 20. The host apparatus 10 includes a clock circuit 13. The clock circuit 13 generates a clock signal CLK for operating the host apparatus 10. The clock signal CLK is supplied to the internal circuit 11, the memory interface circuit 12, and the memory 20.

The memory 20 performs read and write operations based on a control signal (not shown) input from the host apparatus 10. To read data from the memory 20, the host apparatus 10 outputs to the memory 20 a read instruction and an address signal (not shown) of a cell from which data should be read. The memory 20 responds to the read instruction and outputs a data strobe signal DQS together with data DQ read in response to the address signal (not shown) input from the host apparatus 10. The memory interface circuit 12 adjusts timing for receiving the data DQ based on the data strobe signal DQS and outputs the received data to the internal circuit 11.

To write data into the memory 20, the host apparatus 10 outputs to the memory 20 a write instruction and an address signal of a cell to which data should be written, and then outputs a data strobe signal DQS together with data DQ. The memory 20 responds to the write instruction, adjusts the timing for receiving the data DQ based on the data strobe signal DQS, and writes the received data to the cell specified by the address signal.

Figure 4:
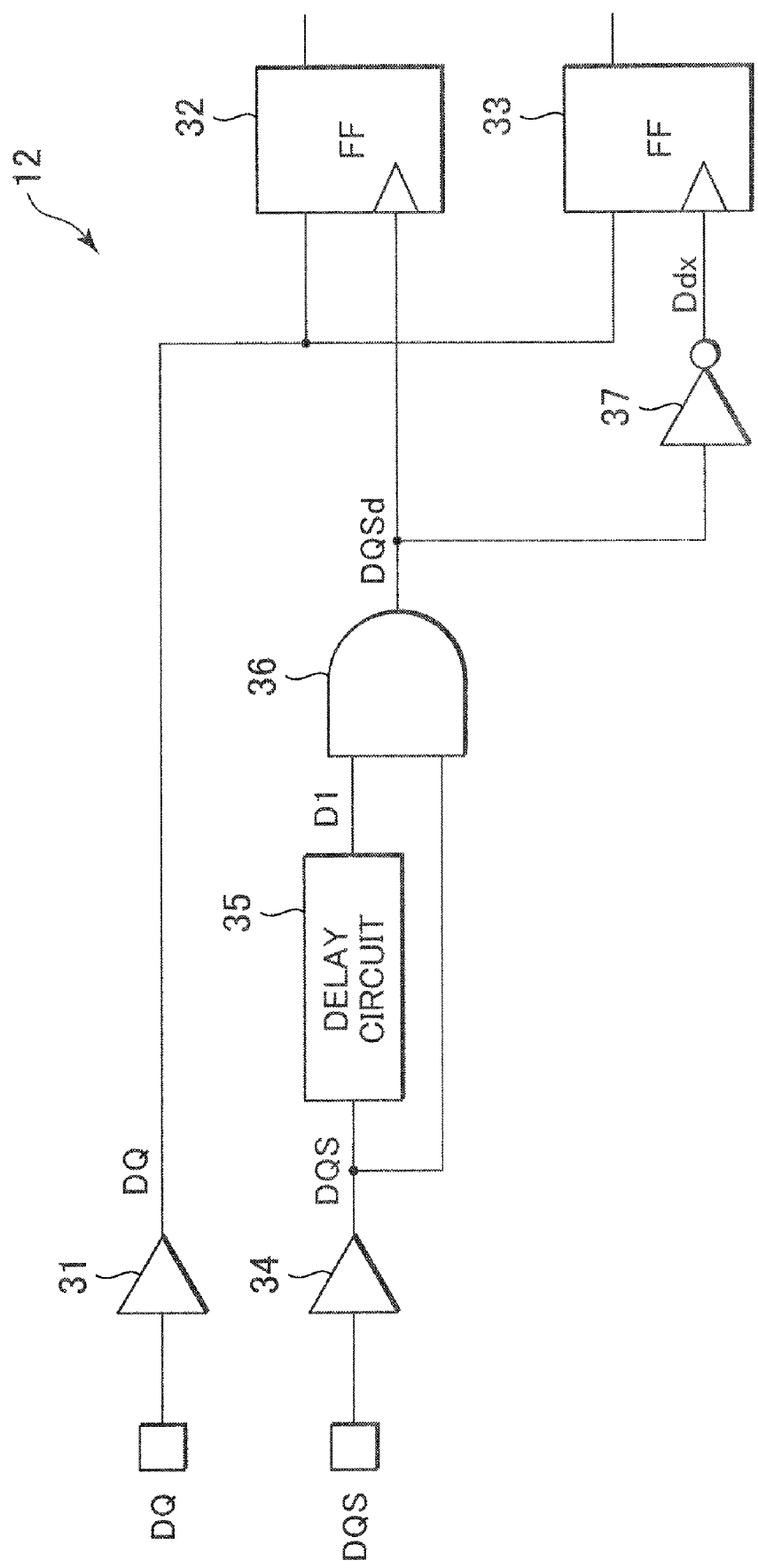
FIG. 4 shows a memory interface circuit of the first embodiment.

FIG. 4 shows the memory interface circuit of the first embodiment. Data DQ is input into a buffer circuit 31 of the memory interface circuit 12. An output terminal of the buffer circuit 31 is connected to the input terminals of flip-flop circuits (hereinafter called simply FF) 32 and 33 as latch circuits. A data strobe signal DQS is input into a buffer circuit 34 of the memory interface circuit 12. An output terminal of the buffer circuit 34 is connected to a delay circuit 35 and an AND circuit 36.

The delay circuit 35 generates a delay signal D1 obtained by delaying an input signal by a predetermined time. The time to be delayed in the delay circuit 35 is set in accordance with the pulse width of a glitch generated by intruding noise.

The delay signal D1 of the delay circuit 35 and an output signal DQS of the buffer circuit 34, that is, a signal DQS before being delayed by the delay circuit 35 and the delay signal D1 are input into the AND circuit 36 as a first logical circuit. Since the buffer circuits 31 and 34 do not substantially change the level of an output signal relative to an input signal, the same symbol is used for the output signal of the buffer circuits 31 and 34 as that for the input signal.

The AND circuit 36 performs a logical operation on the signal DQS and the delay signal D1 and outputs a first strobe signal DQSd. A glitch superimposed on a data strobe signal DQS due to intruding noise has an extremely narrow pulse width compared with that of the data strobe signal DQS. Therefore, a glitch can be removed by delaying the data strobe signal DQS having the glitch by the pulse width of the glitch or more and also performing a logical operation of the data strobe signal DQS before delaying and the delay signal D1 after delaying. That is, a first strobe signal DQSd obtained by removing a glitch by the delay circuit 35 and the AND circuit 36 is output from the AND circuit 36. The first strobe signal DQSd is input into a clock terminal of the first FF 32 as a first latch circuit and also into an inverter circuit 37 as a second logical circuit. The inverter circuit 37 outputs a second strobe signal Ddx obtained by logically inverting the first strobe signal DQSd. The second strobe signal Ddx is input into the clock terminal of the second FF 33 as a second latch circuit.

The first strobe signal DQSd out of phase with the data strobe signal DQS is input into the clock terminal of the first FF 32. The second strobe signal Ddx whose phase is 180 degrees out of phase with the first strobe signal DQSd is input into the clock terminal of the second FF 33. The first FF 32 holds an output signal of the buffer circuit 31 or data DQ in response to a rising edge of the first strobe signal DQSd and outputs a signal of a level substantially equal to the level held by the first FF 32. The second FF 33 holds the output signal of the buffer circuit 31 or data DQ in response to a rising edge of the second strobe signal Ddx and outputs a signal of a level substantially equal to the level held by the second FF 33. In this way, data DQ output in synchronization with both edges of the data strobe signal DQS can be captured alternately by the first FF 32 and the second FF 33.

When the glitches have been substantially reduced or removed from both the signals DQSd and Ddx by the delay circuit 35 and the AND circuit 36, the first FF 32 and the second FF 33 do not mistakenly capture data DQ due to a glitch, thus, preventing a malfunction.

According to the first embodiment, the following effects can be obtained. The delay circuit 35 outputs a delay signal D1 obtained by delaying a data strobe signal DQS. The AND circuit 36 performs a logical operation of the delay signal D1 and the data strobe signal DQS, and outputs an operation result thereof as a first strobe signal DQSd. The inverter circuit 37 receives the first strobe signal DQSd as an input and outputs a second strobe signal Ddx, which is complementary to the first strobe signal DQSd. The first FF 32 latches data DQ based on the first strobe signal DQSd. The second FF 33 latches data DQ based on the second strobe signal Ddx. As described above, a logical operation on the delay signal D1, obtained by the data strobe signal DQS being delayed by the delay circuit 35, and the data strobe signal DQS is performed by the AND circuit 36. Performing this logical operation enables memory interface circuit 12 to generate a first strobe signal DQSd obtained by removing glitch noise from the data strobe signal DQS. The inverter circuit 37 outputs a second strobe signal Ddx obtained by logically inverting the first strobe signal DQSd. The first strobe signal DQSd and the second strobe signal Ddx can prevent the first FF 32 and the second FF 33 from malfunctioning. Such a configuration can prevent malfunctions when capturing data from a memory in the double data rate configuration.

According to the first embodiment, performing a logical operation on a delay signal obtained from a data strobe signal, which is delayed by a delay circuit, and the data strobe signal by a first logical circuit generates a first strobe signal with the glitch noise removed from the data strobe signal. Further, generating a second strobe signal by a second logical circuit from the first strobe signal generates the second strobe signal likewise cleared of the glitch noise. These glitch-free first and second strobe signals prevent the first and second latch circuits from malfunctioning.

Figure 5:
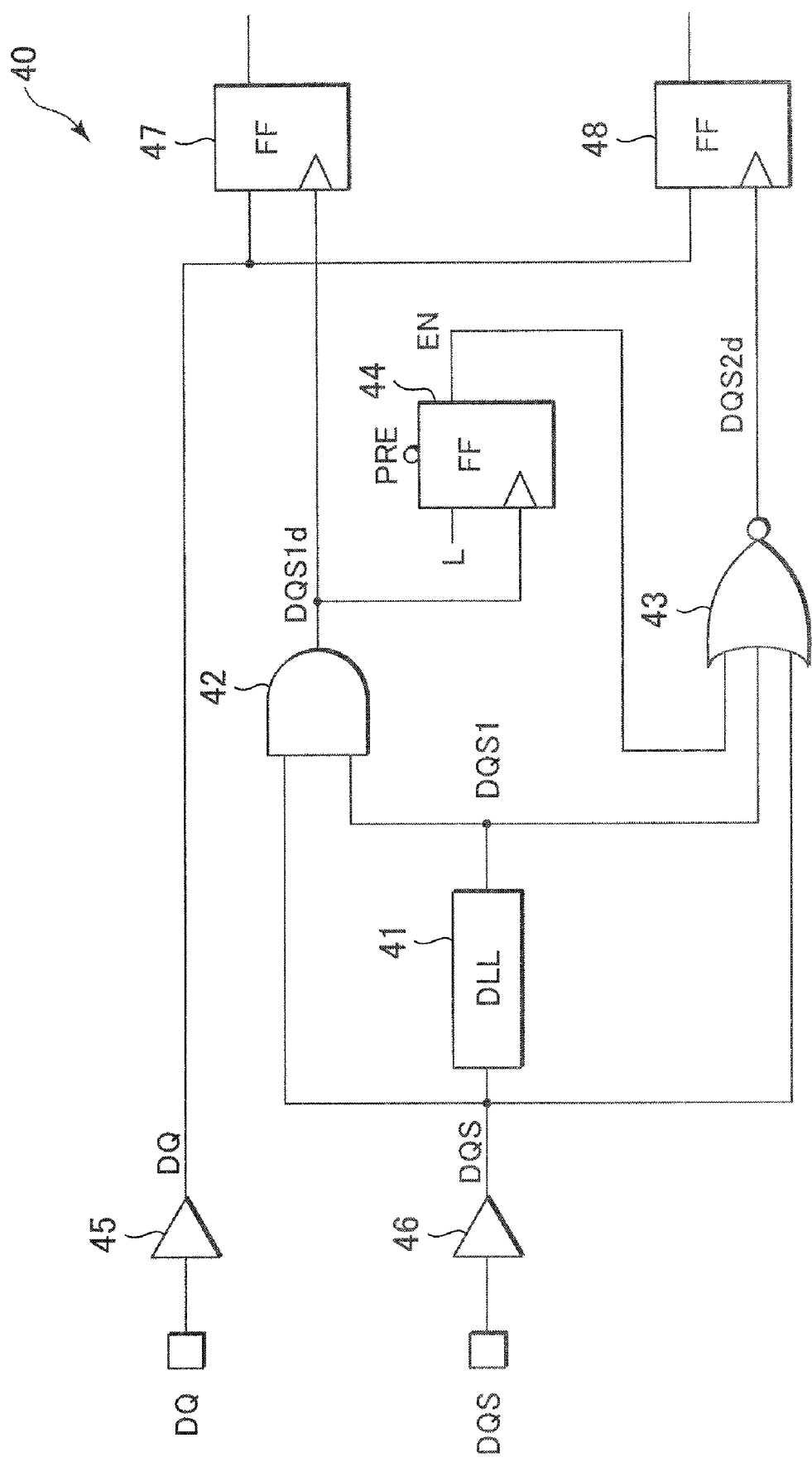
FIG. 5 shows a second embodiment of the invention.

FIG. 5 shows a second embodiment of the invention. An output signal from a buffer circuit 46 of a memory interface circuit 40 is input into a DLL (Delay Locked Loop) circuit 41, an AND circuit 42, and a NOR circuit 43. The DLL circuit 41 generates a delay signal DQS1 obtained by delaying a data strobe signal DQS, which is an input signal, by a ¼ cycle. The delay signal DQS1 is input into the AND circuit 42 and the NOR circuit 43.

The AND circuit 42, as a first logical circuit, outputs a first strobe signal DQS1d from the buffer circuit 46, which is a result of a logical operation on the data strobe signal DQS and the delay signal DQS1 output from the DLL circuit 41. The first strobe signal DQS1$d$ output from the AND circuit 42 is a signal obtained by performing a logical operation on the data strobe signal DQS before delaying, which is an input signal of the DLL circuit 41, and the delay signal DQS1, which is an output signal. That is, the first strobe signal DQS1$d$ is the same as the first strobe signal DQSd in the first embodiment. Thus, the second embodiment can remove glitches whose pulse width is shorter than a ¼ cycle of the data strobe signal DQS.

The first strobe signal DQS1$d$ output from the AND circuit 42 is input into a clock terminal of a first FF 47 and a clock terminal of a third FF 44, as a third logical circuit and a third latch circuit. A data input terminal of the third FF 44 is fixed to the L level. A preset signal is input into a preset terminal of the third FF 44 from a circuit (not shown) when one operation terminates. Therefore, the third FF 44 outputs an enable signal EN of the H level in response to a preset signal and outputs an enable signal EN of the L level in response to a rise of the first strobe signal DQS1$d$. That is, the enable signal EN is the L level between a rise of the first strobe signal DQS1$d$ and an input of the preset signal. Also, the enable signal EN is the H level between an input of the preset signal and a rise of the first strobe signal DQS1$d$. That is, the enable signal EN is the H level until the first strobe signal DQS1$d$ of the H level is input. The enable signal EN is input into the NOR circuit 43.

The output signal from the buffer circuit 46, that is, the data strobe signal DQS, the delay signal DQS1 output from the DLL circuit 41, and the enable signal EN are input into the NOR circuit 43, as second and third logical circuits. The NOR circuit 43 outputs a signal DQS2 of the L level when at least one of these signals DQS, DQS1, and EN is the H level. When all signals DQS, DQS1, and EN are the L level, the NOR circuit 43 outputs the signal DQS2 of the H level. The signal DQS2 is input into a clock input terminal of a second FF 48.

Figure 6:
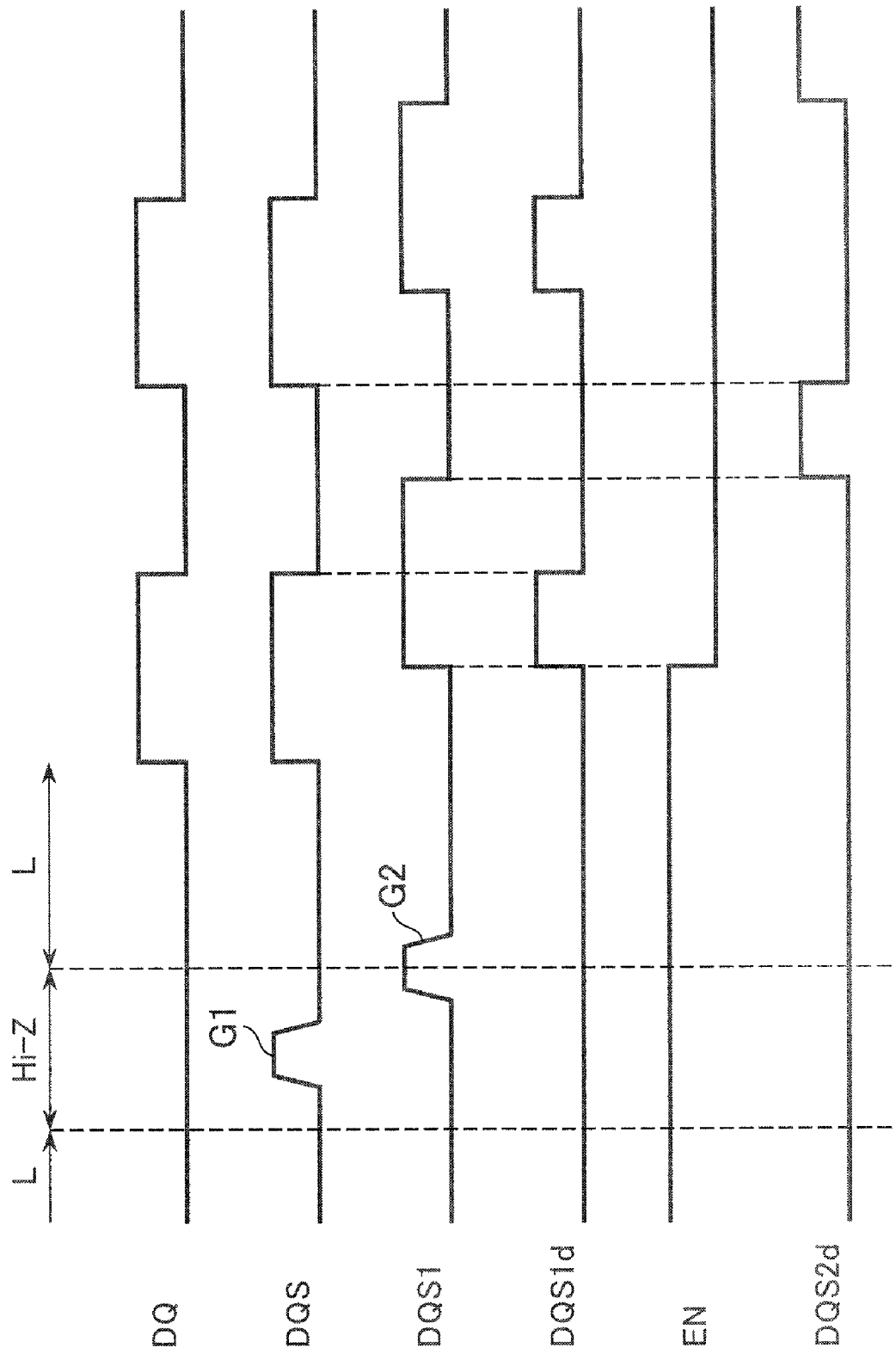
FIG. 6 shows an operation timing diagram of a memory interface circuit in the second embodiment.

FIG. 6 shows an operation timing diagram of the memory interface circuit in the second embodiment. The data strobe signal DQS is in a high impedance state (Hi-Z) between a period when the host apparatus outputs an L-level data strobe signal DQS and a period when the memory 20 outputs an L-level data strobe signal DQS. When noise intrudes in this state, glitch noise G1 arises in the data strobe signal DQS.

The DLL circuit 41 of the memory interface circuit 40 outputs a delay signal DQS1 obtained by delaying the data strobe signal DQS by a ¼ cycle. Glitch noise G2 also arises in the delay signal DQS1. The AND circuit 42 performs a logical operation of both the signals DQS and DQS1 and outputs a first strobe signal DQS Id of the level of the operation result. If, at this point, the glitch noise G2 has a pulse width shorter than the ¼ cycle of the data strobe signal DQS, the noise can be removed.

The third FF 44 outputs an enable signal EN of the L level in response to a rise of the first strobe signal DQS1$d$ from which the glitch noise G2 has been removed. The NOR circuit 43 outputs a signal DQS2 of the L level when at least one of these signals DQS, DQS1, and EN is at the H level. Therefore, while the enable signal EN is the H level, the second strobe signal DQS2$d$ of the L level is output. The enable signal EN reliably holds the H level in the period from when the data strobe signal DQS changes from the high impedance state to the L level to when the first strobe signal DQS1$d$ rises at first, that is, until the data strobe signal DQS rises. Thus, the second strobe signal DQS2$d$ output from the NOR circuit 43 is maintained at the L level. Therefore, no glitch noise is input into the second FF 48 operated by the second strobe signal DQS2$d$. As such, malfunctions of the second FF 33 due to glitch noise can be substantially reduced or prevented.

According to the second embodiment described above, the following effects can be obtained.

The third FF 44 can have a preset terminal. In particular, the third FF 44 outputs the enable signal EN of the H level in response to a signal input into the preset terminal and outputs an enable signal of the L level based on a first strobe signal DQS1$d$. The NOR circuit 43 outputs the second strobe signal DQS2$d$ of the L level based on the enable signal EN of the H level. The NOR circuit 43 outputs the second strobe signal DQS2$d$ as a result of a logical operation on the data strobe signal DQS and the delay signal DQS1 based on the enable signal EN of the L level. As a result, the enable signal EN is kept at the H level until the first strobe signal DQS1$d$ is input, and therefore, the second strobe signal DQS2$d$, without glitch noise, can be generated in the high impedance state.

According to the second embodiment, an enable signal is generated that maintains a predetermined level until a first strobe signal is input. A third logical circuit into which the enable signal is input further generates a second strobe signal based on a data strobe signal and a delay signal, and therefore, the second strobe signal can be generated without glitch noise.

Since the DLL circuit 41 is used as a delay circuit, the delay signal DQS1 can be generated with precision.

The above embodiments include the memory interface circuits 12 and 40 having the data DQ and the data strobe signal DQS input from a memory of the double data rate configuration. However, the embodiments may include an interface circuit that has the data DQ and the data strobe signal DQS input from other circuits.

For purposes of explanation, in the above description, numerous specific details are set forth in order to provide a thorough understanding of the interface circuit. It will be apparent, however, to one skilled in the art that the interface circuit can be practiced without these specific details. In other instances, well-known structures and devices are shown in block diagram form in order to avoid obscuring the interface circuit.

While the interface circuit has been described in conjunction with the specific embodiments thereof, it is evident that many alternatives, modifications, and variations will be apparent to those skilled in the art. Accordingly, embodiments of the interface circuit as set forth herein are intended to be illustrative, not limiting. There are changes that may be made without departing from the spirit and scope of the invention.

What is claimed:

1. An interface circuit, comprising:
   a delay circuit that generates a delay signal obtained by delaying a data strobe signal;
   a first logical circuit that performs a logical operation on the data strobe signal and the delay signal, and outputs an operation result as a first strobe signal;
   a second logical circuit that receives the first strobe signal and generates a second strobe signal that is complementary to the first strobe signal;
   a first latch circuit that latches a data signal based on the first strobe signal; and
   a second latch circuit that latches the data signal based on the second strobe signal;
   wherein the first latch circuit and the second latch circuit are provided in parallel.

2. The interface circuit according to claim 1, wherein the first logical circuit is a logical AND circuit.

3. The interface circuit according to claim 1, wherein the delay circuit is a delay locked loop circuit.

4. The interface circuit according to claim 1, wherein the second logical circuit is an inverter circuit.

5. The interface circuit according to claim 1, wherein the second logical circuit is a logical NOR circuit.

6. The interface circuit according to claim 1, further comprising:
a third latch circuit that includes a preset terminal and generates an enable signal based on a signal input into the preset terminal and the first strobe signal.

7. The interface circuit according to claim 6, wherein the second logical circuit generates the second strobe signal based on the strobe signal, the enable signal, and the delay signal.

8. The interface circuit according to claim 1, further comprising:
a first buffer circuit that receives the data strobe signal; and
a second buffer circuit that receives the data signal.

9. The interface circuit according to claim 1, wherein the data signal and data strobe signal are output from a memory in a double data rate configuration.

10. A memory interface system, comprising:
a host apparatus that includes an internal circuit and a memory interface circuit; and
a memory,
wherein the memory interface system includes:
a delay circuit that generates a delay signal obtained by delaying a data strobe signal;
a first logical circuit that performs a logical operation on the data strobe signal and the delay signal and outputs an operation result as a first strobe signal;
a second logical circuit that receives the first strobe signal and generates a second strobe signal being complementary to the first strobe signal;
a first latch circuit that latches a data signal based on the first strobe signal; and
a second latch circuit that latches the data signal based on the second strobe signal,
the first latch circuit and the second latch circuit are provided in parallel.

11. The memory interface system according to claim 10, wherein the host apparatus includes a clock circuit which generates a clock to be supplied to the internal circuit and the memory interface circuit.

12. The memory interface system according to claim 10, wherein the memory is a memory having a double data rate configuration, and wherein the data strobe signal and the data signal are output from the memory.

13. The memory interface system according to claim 10, wherein the host apparatus sends one selected from a group consisting of a read instruction signal, a write instruction signal, and an address signal to the memory.

14. The memory interface system according to claim 10, wherein the first logical circuit is logical AND circuit.

15. The memory interface system according to claim 10, wherein the delay circuit is a delay locked loop circuit.

16. The memory interface system according to claim 10, wherein the second logical circuit is one selected from a group consisting of an inverter circuit and a logical NOR circuit.

17. A data reception method, comprising:
receiving a strobe signal;
generating a delay signal by delaying the strobe signal;
generating a first strobe signal by performing a logical operation on the strobe signal and the delay signal;
generating a second strobe signal being complementary to the first strobe signal; and
receiving a data signal at a first latch circuit based on the first strobe signal; and
receiving the data signal at a second latch circuit which is provided in parallel with the first latch circuit based on the second strobe signal.

18. The data reception method according to claim 17, further comprising:
receiving a first data signal within one clock signal based on the first strobe signal; and
receiving a second data signal within one clock signal based on the second strobe signal.

19. The data reception method according to claim 17, wherein the logical operation is an AND logical operation.

20. The data reception method according to claim 17, wherein the second strobe signal is generated by performing one selected from a group consisting of an inverter logical operation and a NOR logical operation.

* * * * *